(12) United States Patent
Ohmi

(10) Patent No.: US 9,231,130 B2
(45) Date of Patent: Jan. 5, 2016

(54) PHOTOELECTRIC CONVERSION ELEMENT AND SOLAR CELL

(75) Inventor: Tadahiro Ohmi, Sendai (JP)

(73) Assignee: National University Corporation Tohoku University, Miyagi (JP)

( * ) Notice: Subject to any disclaimer, the term of this patent is extended or adjusted under 35 U.S.C. 154(b) by 3 days.

(21) Appl. No.: 13/188,848

(22) Filed: Jul. 22, 2011

(65) Prior Publication Data

US 2012/0186638 A1 Jul. 26, 2012

Related U.S. Application Data

(63) Continuation of application No. 13/133,397, filed as application No. PCT/JP2009/069995 on Nov. 27, 2009.

(30) Foreign Application Priority Data

Dec. 11, 2008 (JP) .................. 2008-315888

(51) Int. Cl.
*H01L 31/0224* (2006.01)
*H01L 31/028* (2006.01)
*H01L 31/0368* (2006.01)
*H01L 31/0376* (2006.01)
*H01L 31/0392* (2006.01)
(Continued)

(52) U.S. Cl.
CPC ...... *H01L 31/022466* (2013.01); *H01L 31/028* (2013.01); *H01L 31/03682* (2013.01); *H01L 31/03762* (2013.01); *H01L 31/03921* (2013.01); *H01L 31/075* (2013.01); *H01L 31/046* (2014.12); *H01L 31/052* (2013.01); *Y02E 10/546* (2013.01); *Y02E 10/547* (2013.01); *Y02E 10/548* (2013.01)

(58) Field of Classification Search
CPC .................................................... H01L 31/075
USPC ......................................................... 136/255
See application file for complete search history.

(56) References Cited

U.S. PATENT DOCUMENTS 4,338,480 A * 7/1982 Antypas et al. ............... 136/249
4,419,533 A * 12/1983 Czubatyj et al. ............. 136/259
(Continued)

FOREIGN PATENT DOCUMENTS

CN 1748322 A 3/2006
EP 2 093 803 A1 8/2009
(Continued)

OTHER PUBLICATIONS

Machine Translation of JP Application 2008-030707.*
(Continued)

*Primary Examiner* — Matthew Martin
*Assistant Examiner* — Sadie White
(74) *Attorney, Agent, or Firm* — Morgan, Lewis & Bockius LLP

(57) ABSTRACT

Provided is a photoelectric conversion element that has an nip structure formed of amorphous silicon and that is improved in energy conversion efficiency by a structure in which an $n^+$-type a-Si layer is in contact with a transparent electrode formed by an $n^+$-type ZnO layer. This makes it possible to realize photoelectric conversion elements and a solar cell module or facility with large area and high power with an influence on the global resources minimized.

11 Claims, 5 Drawing Sheets

(51) Int. Cl.
*H01L 31/075* (2012.01)
*H01L 31/052* (2014.01)
*H01L 31/046* (2014.01)

(56) References Cited

U.S. PATENT DOCUMENTS

| | | | |
|---|---|---|---|
| 4,573,156 | A | 2/1986 | Anthony et al. |
| 4,959,106 | A | 9/1990 | Nakagawa et al. |
| 5,131,954 | A * | 7/1992 | Vogeli et al. ............... 136/244 |
| 5,164,019 | A * | 11/1992 | Sinton ......................... 136/249 |
| 5,252,142 | A | 10/1993 | Matsuyama et al. |
| 5,279,679 | A | 1/1994 | Murakami et al. |
| 5,718,773 | A * | 2/1998 | Shiozaki ..................... 136/256 |
| 6,268,233 | B1 * | 7/2001 | Sano ............................. 438/57 |
| 6,500,690 | B1 * | 12/2002 | Yamagishi et al. ............. 438/57 |
| 6,501,014 | B1 * | 12/2002 | Kubota et al. ................ 136/256 |
| 7,927,497 | B2 | 4/2011 | Lim et al. |
| 2006/0086385 | A1 * | 4/2006 | Nakano et al. ............... 136/255 |
| 2006/0097259 | A1 | 5/2006 | Suezaki et al. |
| 2008/0107799 | A1 | 5/2008 | Lu et al. |
| 2008/0186788 | A1 * | 8/2008 | Barth ......................... 365/225.7 |
| 2009/0020154 | A1 * | 1/2009 | Sheng et al. ................. 136/255 |
| 2009/0223549 | A1 * | 9/2009 | Ounadjela et al. ........... 136/244 |
| 2010/0051096 | A1 * | 3/2010 | Kim et al. .................... 136/256 |
| 2010/0129994 | A1 | 5/2010 | Awad et al. |
| 2010/0326511 | A1 * | 12/2010 | Wakayama et al. .......... 136/256 |
| 2011/0253208 | A1 | 10/2011 | Ohmi |

FOREIGN PATENT DOCUMENTS

| | | | |
|---|---|---|---|
| EP | 2093803 A1 * | 8/2009 | |
| JP | 5-175529 | 7/1993 | |
| JP | 2008-140920 | 6/2008 | |
| JP | 2008-533737 T | 8/2008 | |
| WO | WO 2008065970 A1 * | 6/2008 | |
| WO | 2008/104059 A1 | 9/2008 | |

OTHER PUBLICATIONS

DE Office Action dated May 18, 2012 for corresponding patent application 11 2009 003 628.7.

Ozgur et al., A comprehensive review of ZnO materials and devices, Journal of Applied Physics, 98:014301 (2005).

Office Action issued by the German Patent Office mailed May 19, 2015 in the corresponding German Patent Application No. 11 2009 003 628.7.

Further Communication issued by the German Patent Office dated May 20, 2015 in the corresponding German Patent Application No. 11 2009 003 628.7.

* cited by examiner n⁺ ZnO (Ga) / α-Si (n⁺)

PHOTOELECTRIC CONVERSION ELEMENT AND SOLAR CELL

This is a continuation application of U.S. Application No. 13/133,397, filed Jun. 8, 2011, which is a U.S. National Phase Entry of PCT Application No. PCT/JP2009/069995, filed Nov. 27, 2009, with a priority date of Dec. 11, 2008, based upon Japanese Patent Application No. 2008-315888.

TECHNICAL FIELD

This invention relates to a photoelectric conversion element and to a solar cell including the photoelectric conversion element.

BACKGROUND ART

In general, as solar cells for converting solar energy into electricity, there have been proposed various solar cells such as silicon-based, compound-based, and organic-based solar cells. It is considered that since the silicon-based solar cells use, as its material, silicon which is present in a large amount as an earth resource, the problem of resource exhaustion or the like does not arise as compared with the other compound-based and organic-based solar cells.

The silicon-based solar cells can be classified into the monocrystalline type, the polycrystalline type, and the amorphous type. Among these silicon-based solar cells, the monocrystalline type and polycrystalline type solar cells are of the bulk type while the amorphous type solar cell is of the thin film type. Herein, it is necessary to form a film having a thickness of about 100 μm for the bulk type silicon solar cell while it is sufficient to form a film having a thickness of about 0.5 μm for the thin film type silicon solar cell.

Recently, among the above-mentioned various solar cells, the bulk-type silicon solar cells tend to be widely used because the energy conversion efficiency is relatively high and further the manufacturing cost is relatively low. However, with the rapid increase in demand for the bulk-type silicon solar cells, a large amount of monocrystalline and polycrystalline silicon might be needed as materials and result in a serious increase in cost. This also might make it difficult to acquire the materials.

In the meanwhile, it has been proposed to use the solar energy as an alternative energy that substitutes for the thermal or hydraulic power. In order to use the solar energy as the alternative energy for substituting the thermal or hydraulic power, there is required a solar cell facility having a large area on the order of 1 km$^2$ to supply high power instead of the thermal or hydraulic power.

In the case of the monocrystalline type or polycrystalline type silicon solar cell, it is necessary to form a thick monocrystalline or polycrystalline silicon film, and therefore, it is very difficult to produce the solar cell facility with a large area and high power in terms of both cost and resource as also described above.

In contrast, in the case of the amorphous type silicon solar cell, the thickness of an amorphous silicon film can be 1/100 or less as compared with the monocrystalline type or polycrystalline type silicon solar cell, and therefore, it is suitable for actually manufacturing, at a low cost, the solar cell facility with a large area and high power.

However, it is pointed out that the amorphous type silicon solar cell is disadvantageous in that the energy conversion efficiency is about 6% to 7% and is extremely low as compared with the monocrystalline type or polycrystalline type silicon solar cell having an energy conversion efficiency of about 20%. In addition, it is also pointed out that the energy conversion efficiency of the amorphous type silicon solar cell decreases with an increase of the area.

Patent Document 1 discloses forming a transparent electrode having an oblique section on a substrate in order to improve the performance of a thin film type solar cell and using one of ZnO, SnO$_2$, and ITO as the transparent electrode.

Patent Document 2 discloses an amorphous type silicon solar cell having SnO$_2$ or ZnO as a transparent electrode layer.

PRIOR ART DOCUMENT

Patent Document

Patent Document 1: JP-A-2008-533737
Patent Document 2: JP-A-H5-175529

SUMMARY OF THE INVENTION

Problem to be Solved by the Invention

Patent Document 1 discloses a transparent electrode processing method that increases an effective area by minimizing the insulation distance between unit cells forming a solar cell, thereby enabling a reduction in the unit cost of production. However, no consideration is made about improving the energy conversion efficiency of a solar cell layer forming an amorphous type silicon solar cell.

Patent Document 2 discloses an amorphous silicon solar cell which has a laminate structure comprising a p-type amorphous silicon layer (hereinafter, a-Si layer) formed on a transparent electrode formed of ZnO or SnO$_2$, with an i-type a-Si layer and an n-type a-Si layer laminated on the p-type a-Si layer in this order. In this case, a back metal electrode is provided on the n-type a-Si layer. However, Patent Document 2 makes it clear that the energy conversion efficiency of the amorphous silicon solar cell having the above-mentioned structure remains at 5.5%.

It is an object of this invention to provide a photoelectric conversion element structure suitable for a solar cell which is mass-produceable and which enables realization of a large-area solar cell facility.

It is an object of this invention to provide a photoelectric conversion element structure which is suitable for manufacturing a solar cell using a ZnO electrode and amorphous silicon and which enables effective use of the resources and realization of a large-area solar cell facility.

Further, it is an object of this invention to obtain an amorphous type silicon solar cell with an energy conversion efficiency exceeding 6% (preferably 10%).

Means for Solving the Problem

According to a first aspect of this invention, there is provided a photoelectric conversion element characterized by comprising a first electrode layer, a second electrode layer, and one or a plurality of power generating laminates provided between the first and second electrode layers, wherein the power generating laminate comprises a p-type semiconductor layer, an i-type semiconductor layer formed in contact with the p-type semiconductor layer, and an n-type semiconductor layer formed in contact with the i-type semiconductor layer, wherein the n-type semiconductor layer of said one power generating laminate or the n-type semiconductor layer of a first electrode side power generating laminate placed on the first electrode side of said plurality of power generating laminates is brought into contact with the first electrode layer and the p-type semiconductor layer of said one power generating laminate or the p-type semiconductor layer of a second electrode side power generating laminate placed on the second electrode side of said plurality of power generating laminates is in contact with the second electrode layer, and wherein the first electrode layer contains ZnO at least at a portion which is brought into contact with the n-type semiconductor layer.

According to a second aspect of this invention, there is provided the photoelectric conversion element according to the first aspect, characterized in that the ZnO of the first electrode layer is doped with Ga, Al, or In to have an n-type conductivity.

According to a third aspect of this invention, there is provided the photoelectric conversion element according to the first or the second aspect, characterized in that the first electrode layer is a transparent electrode.

According to a fourth aspect of this invention, there is provided the photoelectric conversion element according to any one of the first to the third aspects, characterized in that the i-type semiconductor layer in at least one of the power generating laminates is formed of one of crystalline silicon, microcrystalline amorphous silicon, and amorphous silicon.

According to a fifth aspect of this invention, there is provided the photoelectric conversion element according to the first aspect, characterized in that the ZnO of the first electrode layer has an n-type conductivity and the n-type semiconductor layer brought into contact with the first electrode layer is formed of amorphous silicon.

According to a sixth aspect of this invention, there is provided the photoelectric conversion element according to any one of the first to the fifth aspects, characterized in that said one power generating laminate or the first electrode side power generating laminate of said plurality of power generating laminates is formed of amorphous silicon.

According to a seventh aspect of this invention, there is provided the photoelectric conversion element according to any one of the first to the sixth aspects, characterized in that the p-type semiconductor layer brought into contact with the second electrode layer is formed of amorphous silicon and the second electrode layer has at least a portion which is brought into contact with the p-type semiconductor layer and which is formed of Se or Pt.

According to an eighth aspect of this invention, there is provided the photoelectric conversion element according to any one of the first to the sixth aspects, characterized in that the plurality of power generating laminates are present and the second electrode side power generating laminate of said plurality of power generating laminates is formed of microcrystalline silicon.

According to a ninth aspect of this invention, there is provided the photoelectric conversion element according to the eighth aspect, characterized in that the p-type semiconductor layer brought into contact with the second electrode layer is formed of microcrystalline silicon and the second electrode layer has at least a portion which is brought into contact with the p-type semiconductor layer and which contains Ni.

According to a tenth aspect of this invention, there is provided the photoelectric conversion element according to the seventh or the ninth aspect, characterized in that the second electrode layer further comprises an Al layer.

According to an eleventh aspect of this invention, there is provided a solar cell module characterized by comprising the photoelectric conversion element according to any one of the first to the tenth aspects.

Effect of the Invention

According to this invention, a massive, i.e. large-area, solar cell can be easily obtained at a low cost and, further, it is possible to obtain a photoelectric conversion element and a solar cell with high energy conversion efficiency. Moreover, according to this invention, it is possible to obtain an amorphous silicon photoelectric conversion element and an amorphous silicon solar cell which have no problem in terms of global resources and are also economically advantageous.

MODE FOR CARRYING OUT THE INVENTION

Principle of this Invention:

First, this invention aims to realize a photoelectric conversion element and a solar cell with an open circuit voltage Voc of 1.3V or more and with an energy conversion efficiency of 10% or more using amorphous silicon, thereby enabling increase in area, power, and productivity.

Conventionally, in an amorphous silicon solar cell or an amorphous silicon photoelectric conversion element having a pin structure, a structure is usually employed in which a p-type amorphous silicon layer is formed in contact with a transparent electrode while an n-type amorphous silicon layer is in contact with a back electrode.

However, with this structure, as is also clear from Patent Document 2, the open circuit voltage Voc is 0.94V and the energy efficiency is about 5.5%. In contrast, it is suggested in Patent Document 2 that a further improvement can not be established in the pin-structure amorphous silicon solar cell.

The present inventor has obtained knowledge that one of the causes of the above-mentioned problem about the conventional amorphous silicon solar cell is that the amorphous silicon films are coarse films with many defects. Based on this knowledge, amorphous silicon films excellent in quality with few defects are formed by a CVD method using excellent radical reactions.

Further, a transparent electrode is formed without using a rare material (In) such as ITO, but by using a material (Zn) which is present in a large amount in the natural world with little worry about its exhaustion.

In general, indium is often used for forming a transparent electrode, but indium itself is rare as a resource and is expensive. Therefore, it is not expedient to use indium for manufacturing a large-area high-power solar cell facility from an economic point of view and in terms of effective use of the resource.

Taking into account the above-mentioned point, in this invention, zinc (specifically ZnO) which can be sufficiently ensured as a resource is used as a transparent electrode. An impurity is doped into ZnO to increase the semiconductor conductivity. The present inventor has obtained knowledge that it is difficult to dope a p-type impurity while it is easy to dope an n-type impurity such as Ga, Al, or In. As a result, the inventor has found out that n-type ZnO can be actually used.

Further, the present inventor has obtained knowledge that amorphous silicon which is in contact with a ZnO transparent electrode is conventionally p-type amorphous silicon, but that since the difference between work functions of p-type amorphous silicon and n-type ZnO is so large that it is difficult to allow a large current to flow. On the other hand, the present inventor has found out important knowledge that the electron energy difference between conduction bands of n-type amorphous silicon and n-type ZnO is so small that electrons can easily flow and thus it is possible to allow a large current to flow.

Figure 1:
FIG. 1 is a diagram for explaining the principle of a photoelectric conversion element according to this invention.
Figure 1:
Figure 1:
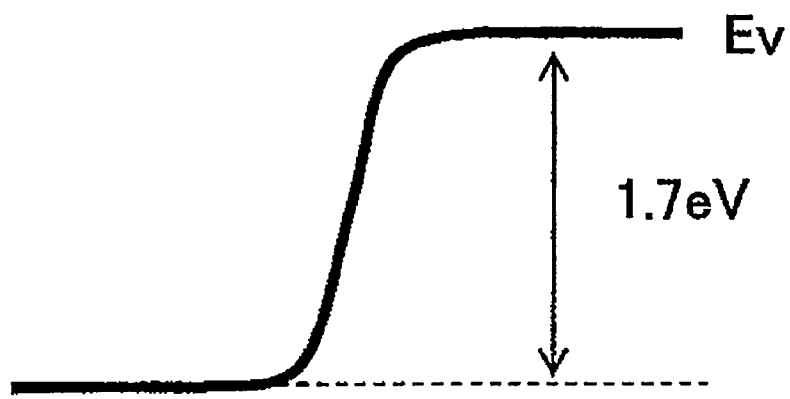

Referring to FIG. 1, the principle structure of a photoelectric conversion element according to this invention is shown. In the case of this example, an n-type amorphous silicon (a-Si) layer makes a junction with an n-type ZnO layer obtained by adding Ga to ZnO. As is also clear from FIG. 1, it is structured that electrons easily flow from the n-type amorphous silicon (a-Si) layer side into the n-type ZnO layer.

Further, FIG. 1 shows an energy band structure when the n-type amorphous silicon (a-Si) layer makes a junction with the n-type ZnO layer (herein, the $n^+$-type ZnO layer). In the illustrated energy band structure, the band gap between a conduction band Ec and a valence band Ev of the a-Si layer shown on the right side is 1.75 eV. On the other hand, a conduction band Ec of the $n^+$-type ZnO layer shown on the left side in the figure is lower than the conduction band Ec of the a-Si layer by 0.2 eV and is lower than the Fermi level.

Therefore, as illustrated, since there is almost no electron barrier between the conduction band Ec of the a-Si layer and the conduction band Ec of the $n^+$-type ZnO layer, electrons flow into the conduction band Ec of the $n^+$-type ZnO layer from the conduction band Ec of the a-Si layer with high efficiency. In this way, since there is almost no barrier between the illustrated a-Si layer and $n^+$-type ZnO layer, electrons can be efficiently moved from the a-Si layer to the $n^+$-type ZnO layer. As a consequence, when a photoelectric conversion element is formed, it is possible to allow a large current to flow and thus to improve the energy efficiency. On the other hand, when p+-type amorphous silicon is brought into contact with n-type ZnO, the difference between conduction bands Ec thereof reaches even 1.6 eV so that it is difficult for electrons to flow into the p+-type amorphous silicon from the n-type ZnO.

Figure 2:
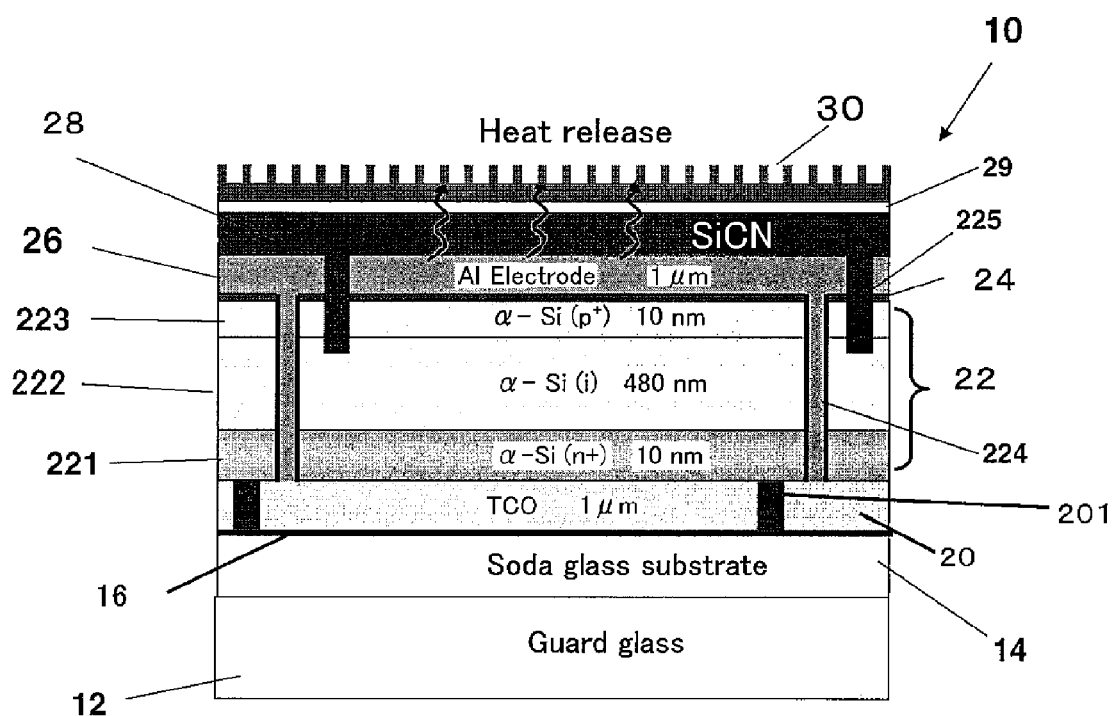
FIG. 2 is a schematic diagram for explaining the structures of a photoelectric conversion element and a solar cell according to an embodiment of this invention.

Referring to FIG. 2, there is shown a photoelectric conversion element 10 according to an embodiment of this invention based on the above-mentioned principle of this invention. The illustrated photoelectric conversion element 10 is provided on a base comprising a guard glass 12 and a glass substrate 14 disposed on the guard glass 12. The illustrated glass substrate 14 is formed of inexpensive soda glass containing Na. For the purpose of preventing contamination of the element due to diffusion of Na from the soda glass, a sodium barrier layer 16 is provided between the photoelectric conversion element 10 and the glass substrate 14. The sodium barrier layer 16 is formed by, for example, coating a surface flattening coating liquid and then drying and sintering it. As is also clear from the figure, the photoelectric conversion element 10 serving as a solar cell unit is electrically connected in series with adjacent other photoelectric conversion elements (solar cell units), thereby forming a solar cell module.

Specifically, the photoelectric conversion element 10 according to the embodiment of this invention comprises a first electrode layer 20, a power generating laminate 22 with a pin structure formed of a-Si, and a second electrode layer 26 of Al formed on the power generating laminate 22 through a selenium layer 24.

The first electrode 20 of the photoelectric conversion element 10 is a transparent conductor electrode (Transparent Conductive Oxide (TCO) layer) and herein is formed by a ZnO layer having a thickness of 1 μm. In this case, the ZnO layer serving as the first electrode 20 is an $n^+$-type ZnO layer doped with Ga. Further, the $n^+$-type ZnO layer forming the first electrode 20 is provided with insulating films 201 (herein, SiCN) at a predetermined interval so as to be divided or partitioned per cell.

An $n^+$-type a-Si layer 221 forming part of the power generating laminate 22 is provided on the first electrode 20. The $n^+$-type a-Si layer 221 is brought into contact with the transparent electrode forming the first electrode 20. The illustrated $n^+$-type a-Si layer 221 has a thickness of 10 nm. An i-type a-Si layer 222 and a p-type a-Si layer 223 are formed in this order on the $n^+$-type a-Si layer 221 to provide the power generating laminate 22. The illustrated i-type a-Si layer 222 and p-type a-Si layer 223 have thicknesses of 480 nm and 10 nm, respectively. The illustrated $n^+$-type a-Si layer 221, i-type a-Si layer 222, and p+-type a-Si layer 223 serving as the power generating laminate 22 are provided with via holes 224 at positions different from those of the insulating layers 201 of the first electrode 20. A $SiO_2$ layer is formed on an inner wall of each via hole.

Thus, the above-mentioned nip-structure of the power generating laminate 22 has a total thickness of 500 nm which is 1/100 or less as compared with a photoelectric conversion element formed of monocrystalline or polycrystalline silicon.

Then, the second electrode layer 26 of Al is formed on the p-type a-Si layer 223 through the selenium (Se) layer 24. The Al forming the second electrode layer 26 is also formed in the via holes 224 (the inner wall is insulated by $SiO_2$) of the power generating laminate 22. The Al in the via holes 224 is electrically connected to the first electrodes 20 of the adjacent other photoelectric conversion elements. The selenium (Se) layer 24 is formed as a contact portion of the second electrode with the p-type a-Si layer. This is because the work function of Se (−6.0 eV) is close to that of the p-type a-Si layer, and therefore, it may be replaced by Pt which also has an approximate work function (−5.7 eV).

Further, a passivation film 28 of SiCN is formed on the second electrode 26. The insulating material (herein, SiCN) forming the passivation film 28 is also buried in holes 225 reaching the i-type a-Si layer 222 through the second electrode 26/24 and the p-type a-Si layer 223. On the passivation film 28, a heat sink 30 (e.g. formed of Al) is attached through an adhesive layer 29 formed of a material with excellent thermal conductivity.

As the ZnO layer forming the first electrode layer 20, an $n^+$-type ZnO layer can be formed by doping Al, In, or the like instead of Ga.

The photoelectric conversion element 10 shown in FIG. 2 could practically accomplish an energy conversion efficiency of about 20% per cell. Further, when each photoelectric conversion element 10 was connected to form a solar cell module of 1.15 m×1.40 m, a power of 307 W was obtained and the energy conversion efficiency in the module was 18.9%.

Hereinbelow, a method of manufacturing the photoelectric conversion elements 10 and the solar cell shown in FIG. 2 will be described with reference to FIGS. 3A to 3H. In this example, use is made of a system in which a MSEP (Metal Surface-wave Excited Plasma) type plasma processing apparatus (may be either a type which has lower gas nozzles or a lower gas shower plate or a type which has none of them) proposed in the specification of JP Patent Application No. 2008-153379 (JP-A-2009-302205) previously filed by the present inventor et al. is used as each of first to eighth plasma processing apparatuses in a cluster arrangement.

Figure 3A:
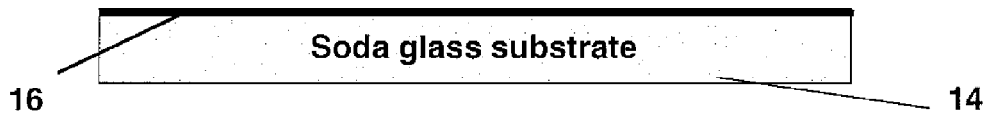
FIG. 3A is a diagram for explaining, in order of processes, a manufacturing process of photoelectric conversion elements shown in FIG. 2.

As shown in FIG. 3A, first, the sodium barrier layer 16 having a thickness of 0.2 μm is formed on a surface of the glass substrate 14 made of soda glass in a low-pressure atmosphere of about 5 Torr.

Figure 3B:
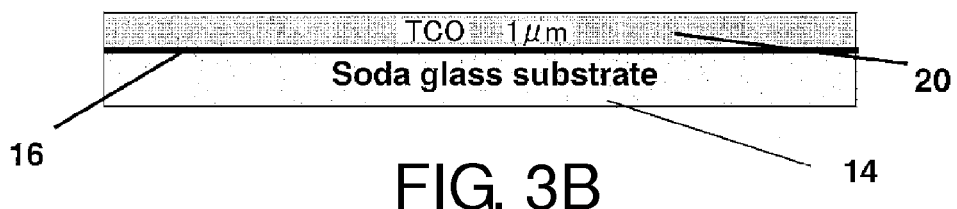
FIG. 3B is a diagram for explaining, in order of processes, a manufacturing process of the photoelectric conversion elements shown in FIG. 2.

Then, as shown in FIG. 3B, the glass substrate 14 formed with the sodium barrier layer 16 is introduced into the first plasma processing apparatus having lower gas nozzles or a lower gas shower plate, where the transparent electrode (TCO layer) having a thickness of 1 μm is formed for the first electrodes 20. In the first plasma processing apparatus, the $n^+$-type ZnO layer is formed by doping Ga. In the first plasma processing apparatus, the Ga-doped $n^+$-type ZnO layer is formed by plasma CVD on the sodium barrier layer 16 by supplying a mixed gas of Kr and $O_2$ into a chamber from upper gas nozzles, producing a plasma, and ejecting a mixed gas of Ar, Zn $(CH_3)_2$, and Ga $(CH_3)_3$ from the lower gas nozzles or the lower gas shower plate into the plasma produced in the atmosphere containing Kr and oxygen.

Figure 3C:
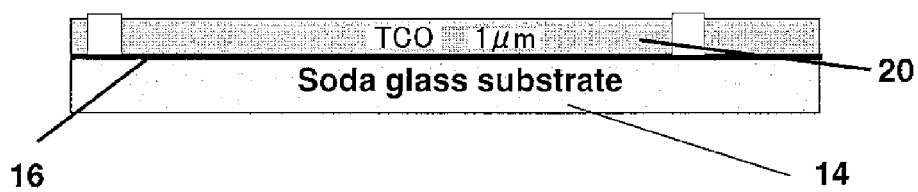
FIG. 3C is a diagram for explaining, in order of processes, a manufacturing process of the photoelectric conversion elements shown in FIG. 2.

Subsequently, a photoresist is coated on the $n^+$-type ZnO layer (20) and then the photoresist is patterned using the photolithography technique. After patterning the photoresist, the glass substrate 14 with the patterned photoresist is introduced into the second plasma processing apparatus having lower gas nozzles or a lower gas shower plate. In the second plasma processing apparatus, the $n^+$-type ZnO layer is selectively etched using the patterned photoresist as a mask so that, as shown in FIG. 3C, openings reaching the sodium barrier layer 16 are formed in the $n^+$-type ZnO layer which forms the first electrodes 20. The etching in the second plasma processing apparatus is carried out by supplying an Ar gas into a chamber from upper gas nozzles and supplying a mixed gas of Ar, $Cl_2$, and HBr from the lower gas nozzles or the lower gas shower plate into a plasma produced in the Ar atmosphere.

The glass substrate 14 with the $n^+$-type ZnO layer having the openings and with the photoresist coated on the $n^+$-type ZnO layer is conveyed into the third plasma processing apparatus having neither lower gas nozzles nor a lower gas shower plate. In the third plasma processing apparatus, the photoresist is removed by ashing in a $Kr/O_2$ plasma atmosphere.

After removing the photoresist, the glass substrate 14 with the $n^+$-type ZnO layer (first electrodes 20) formed with the openings is introduced into the fourth plasma processing apparatus having lower gas nozzles or a lower gas shower plate. In the fourth plasma processing apparatus, first, SiCN is formed as the insulating film 201 by plasma CVD in the openings and on a surface of the $n^+$-type ZnO layer (20). Then, the SiCN on the surface of the $n^+$-type ZnO layer (20) is removed by etching in the same fourth plasma processing apparatus. As a result, the insulating film 201 is buried only in the openings of the $n^+$-type ZnO layer (20). In the fourth plasma processing apparatus, the SiCN film is formed by CVD by supplying a $Xe/NH_3$ gas mixture into a chamber from upper gas nozzles, producing a plasma, and introducing a mixed gas of Ar, $SiH_4$, and SiH $(CH_3)_3$ into the chamber from the lower gas nozzles or the lower gas shower plate. Then, switching the feed gases, in the same chamber, the SiCN on the surface of the $n^+$-type ZnO layer (20) is removed by etching by supplying an Ar gas into the chamber from the upper gas nozzles, producing a plasma, and introducing a mixed gas of Ar and $CF_4$ into the chamber from the lower gas nozzles or the lower gas shower plate.

Figure 3D:
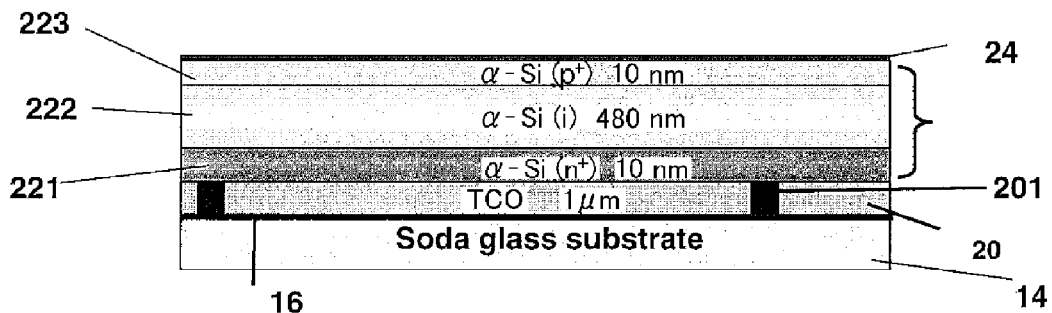
FIG. 3D is a diagram for explaining, in order of processes, a manufacturing process of the photoelectric conversion elements shown in FIG. 2.

Subsequently, in the same fourth plasma processing apparatus, the power generating laminate 22 having the nip structure and the Se 24 are formed by continuous CVD by switching feed gases in sequence. As shown in FIG. 3D, in the fourth plasma processing apparatus, the $n^+$-type a-Si layer 221, the i-type a-Si layer 222, the $p^+$-type a-Si layer 223, and the selenium (Se) layer 24 are formed in this order. Specifically, in the fourth plasma processing apparatus, the $n^+$-type a-Si layer 221 is formed by plasma CVD by supplying a mixed gas of Ar and $H_2$ into the chamber from the upper gas nozzles, producing a plasma, and introducing a mixed gas of Ar, $SiH_4$, and $PH_3$ into the chamber from the lower gas nozzles or the lower gas shower plate. Then, while continuously supplying the mixed gas of Ar and $H_2$ into the chamber from the upper gas nozzles and producing a plasma, the i-type a-Si layer 222 is formed by switching the $Ar/SiH_4/PH_3$ gas mixture to an $Ar/SiH_4$ gas mixture and introducing it from the lower gas nozzles or the lower gas shower plate. Further, while continuously supplying the mixed gas of Ar and $H_2$ into the chamber from the upper gas nozzles and producing a plasma, the $p^+$-type a-Si layer 223 is formed by replacing the $Ar/SiH_4$ gas mixture from the lower gas nozzles or the lower gas shower plate by an $Ar/SiH_4/B_2H_6$ gas mixture. Then, while continuously supplying the mixed gas of Ar and $H_2$ into the chamber from the upper gas nozzles and producing a plasma, the selenium layer 24 is formed by CVD by replacing the $Ar/SiH_4/B_2H_6$ gas mixture from the lower gas nozzles or the lower gas shower plate by a mixed gas of Ar and $H_2Se$. In this manner, since the formation and etching of the six layers are carried out by switching the feed gases in sequence in the same MSEP type plasma processing apparatus, it is possible to form the excellent films with few defects and simultaneously to significantly reduce the manufacturing cost.

The glass substrate 14 formed with the selenium layer 24 and the power generating laminate 22 is introduced from the fourth plasma processing apparatus into a photoresist coater (slit coater), where a photoresist is coated and then the photoresist is patterned using the photolithography technique.

Figure 3E:
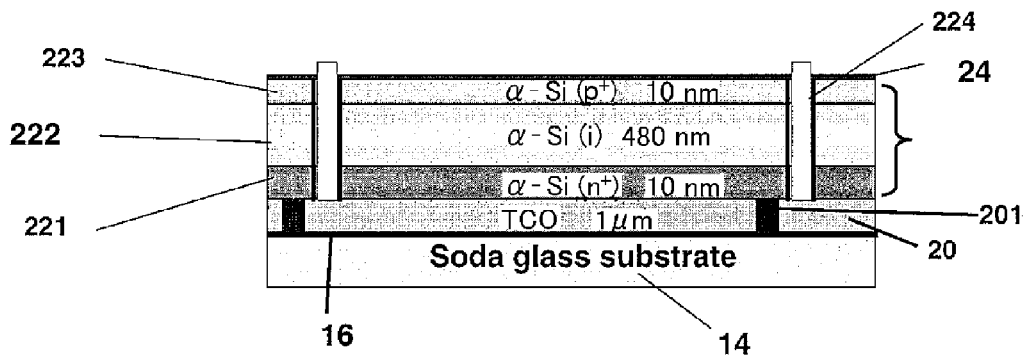
FIG. 3E is a diagram for explaining, in order of processes, a manufacturing process of the photoelectric conversion elements shown in FIG. 2.

After patterning the photoresist, the glass substrate 14 formed with the selenium layer 24 and the power generating laminate 22 is, along with the patterned photoresist, introduced into the fifth plasma processing apparatus having lower gas nozzles or a lower gas shower plate. In the fifth plasma processing apparatus, the selenium layer 24 and the power generating laminate 22 are selectively etched using the photoresist as a mask so that, as shown in FIG. 3E, the via holes 224 reaching the first electrodes 20 are formed. That is, the four layers are continuously etched in the fifth plasma processing apparatus.

Specifically, while a mixed gas of Ar and $H_2$ is being supplied into a chamber from upper gas nozzles and producing a plasma, the etching of the selenium layer 24 is carried out by ejecting a mixed gas of Ar and $CH_4$ into the plasma from the lower gas nozzles or the lower gas shower plate. Subsequently, while continuously supplying Ar into the chamber from the upper gas nozzles and producing a plasma, the etching of the power generating laminate 22 comprising the nip three layers is carried out by ejecting an Ar/HBr gas mixture from the lower gas nozzles or the lower gas shower plate.

The glass substrate 14 is provided, by the etching in the fifth plasma processing apparatus, with the via holes 224 that pass through the layers from the selenium layer 24 and that reach the first electrodes 20. Thereafter, the glass substrate is transferred from the fifth plasma processing apparatus into the above-mentioned third plasma processing apparatus having neither lower gas nozzles nor a lower gas shower plate, where the photoresist is removed by ashing in a plasma produced in an atmosphere of a $Kr/O_2$ gas mixture introduced into a chamber from upper gas nozzles.

Figure 3F:
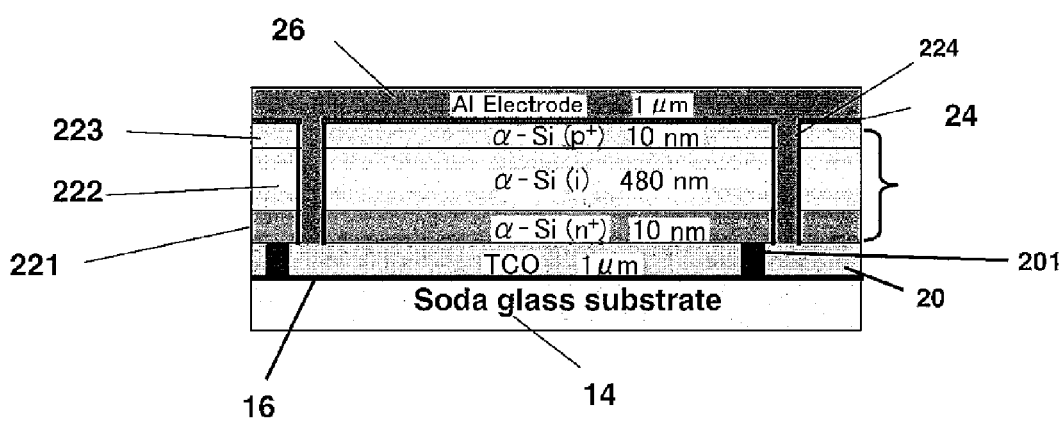
FIG. 3F is a diagram for explaining, in order of processes, a manufacturing process of the photoelectric conversion elements shown in FIG. 2.

The glass substrate 14, after the removal of the photoresist, is transferred into the sixth plasma processing apparatus having lower gas nozzles or a lower gas shower plate, where, as shown in FIG. 3F, the Al layer having a thickness of 1 μm is formed as the second electrode 26 on the selenium layer 24. The Al layer is also formed in the via holes 224. While a mixed gas of Ar and $H_2$ is being supplied into a chamber from upper gas nozzles and producing a plasma, the formation of the Al layer is carried out by ejecting an Ar/Al $(CH_3)_3$ gas mixture into the plasma, produced in the $Ar/H_2$ atmosphere, from the lower gas nozzles or the lower gas shower plate.

Subsequently, a photoresist is coated on the Al layer, i.e. the second electrode 26, and then is patterned. The glass substrate 14 with the patterned photoresist is introduced into the seventh plasma processing apparatus having lower gas nozzles or a lower gas shower plate.

Figure 3G:
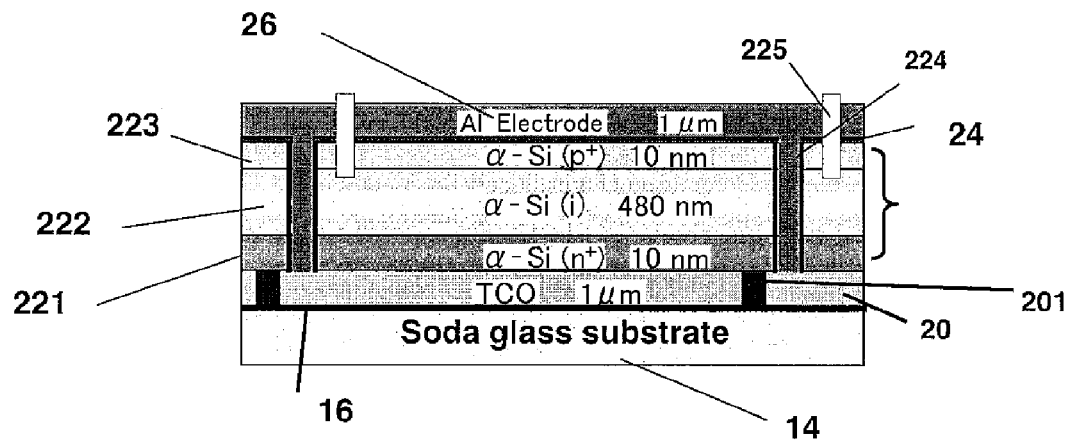
FIG. 3G is a diagram for explaining, in order of processes, a manufacturing process of the photoelectric conversion elements shown in FIG. 2.

In the seventh plasma processing apparatus, the Al layer is etched by, while supplying an Ar gas into a chamber from upper gas nozzles and producing a plasma, ejecting an $Ar/Cl_2$ gas mixture into the plasma, produced in the Ar atmosphere, from the lower gas nozzles or the lower gas shower plate. Subsequently, while supplying a mixed gas of Ar and $H_2$ into the chamber from the upper gas nozzles and producing a plasma, the selenium layer 24 is etched by introducing an $Ar/CH_4$ gas mixture into the plasma, produced in the $Ar/H_2$ atmosphere, from the lower gas nozzles or the lower gas shower plate. Then, while supplying an Ar gas into the chamber from the upper gas nozzles and producing a plasma, the $p^+$-type a-Si layer 223 and part of the i-type a-Si layer 222 are etched by switching the gases from the lower gas nozzles or the lower gas shower plate to an Ar/HBr gas mixture. As a result, as shown in FIG. 3G, the holes 225 reaching midway of the i-type a-Si layer 222 from a surface of the Al layer 26 are formed. Also in this process, the four layers are continuously etched by switching the gases in sequence in the same MSEP type plasma processing apparatus. Thus, the processing time and cost are significantly reduced.

Then, the glass substrate 14 having thereon the elements shown in FIG. 3G is transferred into the above-mentioned third plasma processing apparatus having neither lower gas nozzles nor a lower gas shower plate, where the photoresist is removed by ashing in a plasma produced in an atmosphere of a $Kr/O_2$ gas mixture introduced into the chamber from the upper gas nozzles.

Figure 3H:
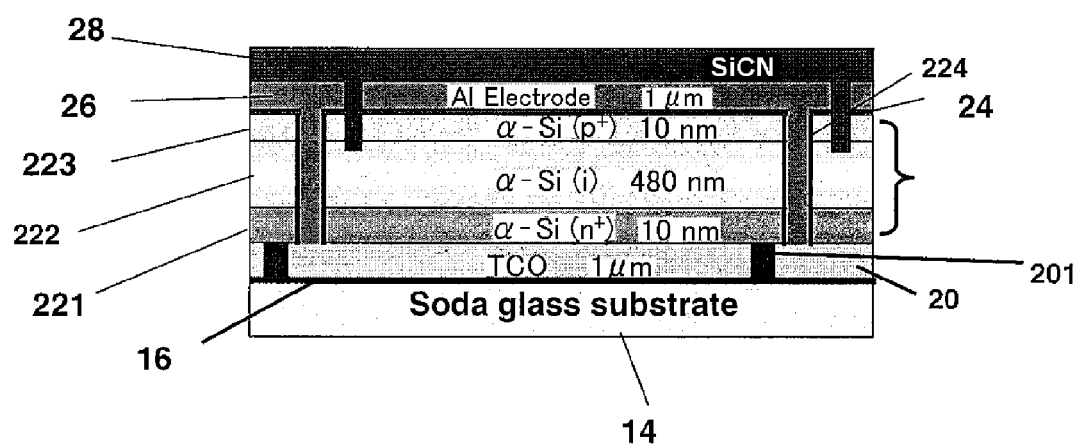
FIG. 3H is a diagram for explaining, in order of processes, a manufacturing process of the photoelectric conversion elements shown in FIG. 2.

The glass substrate 14 having, as the second electrode 26, the Al layer with the photoresist removed is introduced into the eighth plasma processing apparatus having lower gas nozzles or a lower gas shower plate, where the SiCN film is formed by CVD so that the insulating layer 28 is formed on the Al layer 26 and in the holes 225. As a consequence, the required photoelectric conversion elements and solar cell unit and/or solar cell module are produced as shown in FIG. 3H. The SiCN film is formed by supplying a $Xe/NH_3$ gas mixture into a chamber from upper gas nozzles, producing a plasma, and ejecting an $Ar/SiH_4/SiH\ (CH_3)_3$ gas mixture from the lower gas nozzles or the lower gas shower plate.

According to the above-mentioned manufacturing method, it is possible to use the same plasma processing apparatus for forming a plurality of layers and so on. Therefore, it is possible to produce the photoelectric conversion elements and the solar cell unit and/or the solar cell module in the state where contamination due to oxygen, impurities, and so on in the atmosphere is removed.

As a result, the energy conversion efficiency in the single photoelectric conversion element can be enhanced to 20% and the energy efficiency of the module formed by the plurality of photoelectric conversion elements can be improved to 18.9%.

In the above-mentioned embodiment, the description has been given of only the case where the nip-structure power generating laminate is all formed by the a-Si layers. However, the i-type a-Si layer may be formed of crystalline silicon or microcrystalline amorphous silicon. Further, one or more power generating laminates may be deposited on the power generating laminate 22.

Next, another embodiment will be described as an example in which another power generating laminate is deposited on the power generating laminate 22.

Figure 4:
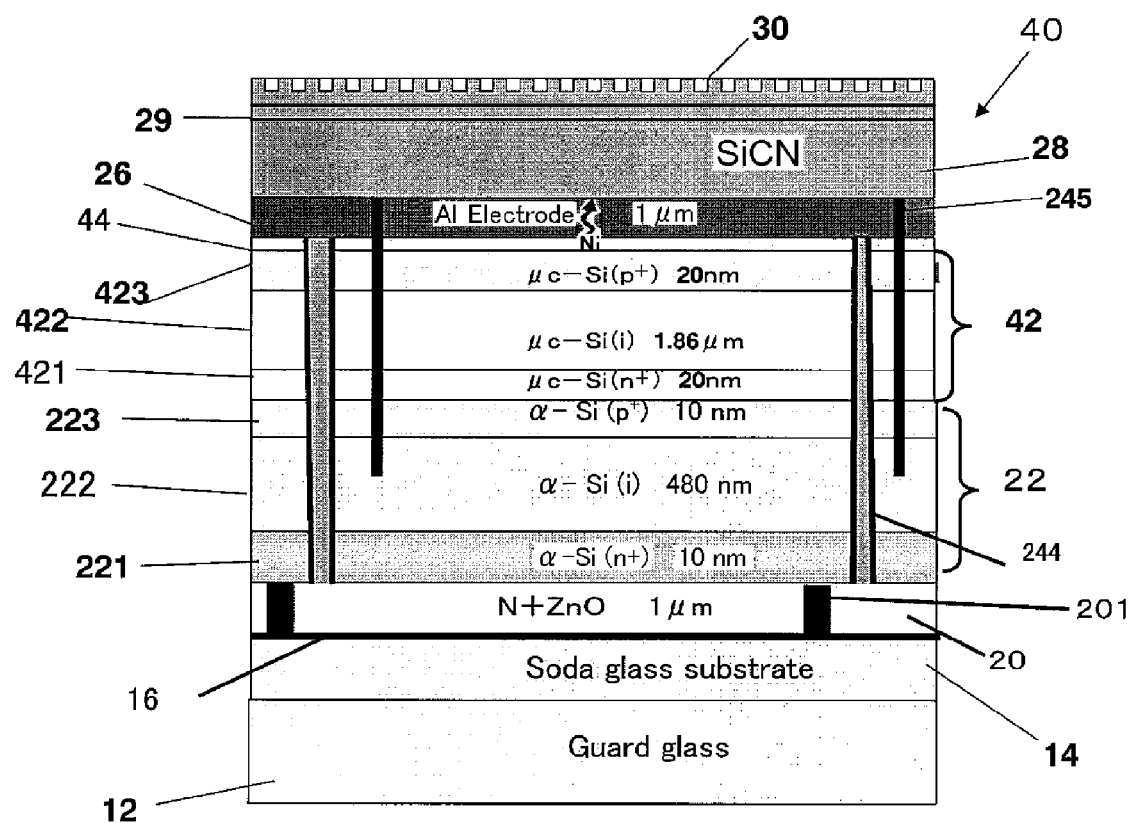
FIG. 4 is a schematic diagram for explaining the structures of a photoelectric conversion element and a solar cell according to another embodiment of this invention.

Referring to FIG. 4, there is shown a photoelectric conversion element 40 according to another embodiment of this invention based on the above-mentioned principle of this invention. In FIG. 4, the same reference numerals as those in FIG. 2 are assigned to the same portions as those of the element of FIG. 2. For those portions with the same reference numerals as in FIG. 2, a detailed description will be omitted. The photoelectric conversion element 40 in FIG. 4 has, through a sodium barrier layer 16 and an $n^+$-type ZnO layer having a thickness of 1 μm and serving as a first electrode 20, a power generating laminate 22 with an nip structure formed of the same a-Si as in the previous embodiment on a glass substrate 14 formed of inexpensive soda glass containing Na. In FIG. 4, a second power generating laminate 42 with an nip structure formed of microcrystalline silicon (μc-Si) is provided on the power generating laminate 22 and a second electrode layer 26 of Al is formed on the second power generating laminate 42 through a nickel (Ni) layer 44.

Specifically, an $n^+$-type μc-Si layer 421 forming part of the second power generating laminate 42 is provided on the power generating laminate 22 so as to be in contact with a $p^+$-type a-Si layer 223. The illustrated $n^+$-type μc-Si layer 421 has a thickness of 20 nm. An i-type μc-Si layer 422 and a p-type μc-Si layer 423 forming the second power generating laminate 42 are formed in this order on the $n^+$-type μc-Si layer 421. The i-type μc-Si layer 422 and the p-type μc-Si layer 423 have thicknesses of 1.86 μm and 20 nm, respectively. Via holes 244 are provided so as to reach the first electrodes 20 from the Al layer 26 through an $n^+$-type a-Si layer 221, an i-type a-Si layer 222, and the $p^+$-type a-Si layer 223 forming the power generating laminate 22, the $n^+$-type μc-Si layer 421, the i-type μc-Si layer 422, and the p-type μc-Si layer 423 forming the second power generating laminate 42, and the Ni layer 44. An inner wall of each via hole is coated with a $SiO_2$ layer and each via hole is provided therein with an Al layer so that one photoelectric conversion element is connected in series with adjacent other photoelectric conversion elements.

The second power generating laminate 42 formed of microcrystalline silicon has a total thickness of 2.26 µm and serves to absorb sunlight with wavelengths that cannot be absorbed by the power generating laminate 22 formed of amorphous silicon, thereby enhancing the total power generation efficiency. As a result, the power generation efficiency reaches 30% in the illustrated structure.

The nickel (Ni) layer 44 forming a contact portion of the second electrode with the p-type µc-Si layer 423 is employed because its work function is close to that of the p-type µc-Si layer. Although SiCN insulating holes 245 reach the i-type a-Si layer 222 through the second electrode 26, the Ni layer 44, the $p^+$-type µc-Si layer 423, the i-type µc-Si layer 422, the n-type µc-Si layer 421, and the p-type a-Si layer 223, since µc-Si has a high resistance, it may be configured that the holes 245 are stopped upon reaching the i-type µc-Si layer 422.

Next, a method of manufacturing the photoelectric conversion elements 40 and the solar cell shown in FIG. 4 will be described. In this example, a description will be given of a case where a MSEP (Metal Surface-wave Excited Plasma) type plasma processing apparatus (having lower gas nozzles or a lower gas shower plate or having none of them) proposed in the specification of JP Patent Application No. 2008-153379 (JP-A-2009-302205) previously filed by the present inventor et al. is used as each of first to eighth plasma processing apparatuses and use is made of a system in which these plasma processing apparatuses are arranged in a cluster.

First, the sodium barrier layer 16 having a thickness of 0.2 µm is formed on a surface of the glass substrate 14 made of soda glass in a low-pressure atmosphere of about 5 Torr.

Then, the glass substrate 14 formed with the sodium barrier layer 16 is introduced into the first plasma processing apparatus having lower gas nozzles or a lower gas shower plate, where the transparent electrode (TCO layer) having a thickness of 1 µm is formed for the first electrodes 20. In the first plasma processing apparatus, the $n^+$-type ZnO layer is formed by doping Ga. In the first plasma processing apparatus, the Ga-doped $n^+$-type ZnO layer is formed by plasma CVD on the sodium barrier layer 16 by supplying a mixed gas of Kr and $O_2$ into a chamber from upper gas nozzles, producing a plasma, and ejecting a mixed gas of Ar, Zn $(CH_3)_2$, and Ga $(CH_3)_3$ from the lower gas nozzles or the lower gas shower plate into the plasma produced in the atmosphere containing Kr and oxygen.

Subsequently, a photoresist is coated on the $n^+$-type ZnO layer (20) and then the photoresist is patterned using the photolithography technique. After patterning the photoresist, the glass substrate 14 with the patterned photoresist is introduced into the second plasma processing apparatus having lower gas nozzles or a lower gas shower plate. In the second plasma processing apparatus, the $n^+$-type ZnO layer is selectively etched using the patterned photoresist as a mask so that openings reaching the sodium barrier layer 16 are formed in the $n^+$-type ZnO layer which serves as the first electrodes 20. The etching in the second plasma processing apparatus is carried out by supplying an Ar gas into a chamber from upper gas nozzles and supplying a mixed gas of Ar, $Cl_2$, and HBr from the lower gas nozzles or the lower gas shower plate into a plasma produced in the Ar atmosphere.

The glass substrate 14 with the $n^+$-type ZnO layer having the openings and with the photoresist coated on the $n^+$-type ZnO layer is conveyed into the third plasma processing apparatus having neither lower gas nozzles nor a lower gas shower plate. In the third plasma processing apparatus, the photoresist is removed by ashing in a $Kr/O_2$ plasma atmosphere.

After removing the photoresist, the glass substrate 14 with the $n^+$-type ZnO layer, which serves as the first electrodes 20, formed with the openings is introduced into the fourth plasma processing apparatus having lower gas nozzles or a lower gas shower plate. In the fourth plasma processing apparatus, first, SiCN is formed as an insulating film 201 by plasma CVD in the openings and on a surface of the $n^+$-type ZnO layer (20). Then, the SiCN on the surface of the $n^+$-type ZnO layer (20) is removed by etching in the same fourth plasma processing apparatus. As a result, the insulating film 201 is buried only in the openings of the $n^+$-type ZnO layer (20). In the fourth plasma processing apparatus, the SiCN film is formed by CVD by supplying a $Xe/NH_3$ gas mixture into a chamber from upper gas nozzles, producing a plasma, and introducing a mixed gas of Ar, $SiH_4$, and SiH $(CH_3)_3$ into the chamber from the lower gas nozzles or the lower gas shower plate. Then, switching the feed gases, in the same chamber, the SiCN on the surface of the $n^+$-type ZnO layer (20) is removed by etching by supplying an Ar gas into the chamber from the upper gas nozzles, producing a plasma, and introducing a mixed gas of Ar and $CF_4$ into the chamber from the lower gas nozzles or the lower gas shower plate.

Subsequently, in the same fourth plasma processing apparatus, the power generating laminate 22 having the nip structure, the second power generating laminate 42 having the nip structure, and the Ni layer 24 are formed in this order by continuous CVD by switching feed gases in sequence. Specifically, in the fourth plasma processing apparatus, the $n^+$-type a-Si layer 221 is formed by plasma CVD by supplying a mixed gas of Ar and $H_2$ into the chamber from the upper gas nozzles, producing a plasma, and introducing a mixed gas of Ar, $SiH_4$, and $PH_3$ into the chamber from the lower gas nozzles or the lower gas shower plate. Then, while continuously supplying the mixed gas of Ar and $H_2$ into the chamber from the upper gas nozzles and producing a plasma, the i-type a-Si layer 222 is formed by switching the $Ar/SiH_4/PH_3$ gas mixture to an $Ar/SiH_4$ gas mixture and introducing it from the lower gas nozzles or the lower gas shower plate. Further, while continuously supplying the mixed gas of Ar and $H_2$ into the chamber from the upper gas nozzles and producing a plasma, the $p^+$-type a-Si layer 223 is formed by replacing the $Ar/SiH_4$ gas mixture from the lower gas nozzles or the lower gas shower plate by an $Ar/SiH_4/B_2H_6$ gas mixture.

Subsequently, the $n^+$-type µc-Si layer 421 is formed by plasma CVD by supplying the mixed gas of Ar and $H_2$ into the chamber from the upper gas nozzles, producing a plasma, and introducing a mixed gas of Ar, $SiH_4$, and $PH_3$ into the chamber from the lower gas nozzles or the lower gas shower plate. Then, while continuously supplying the mixed gas of Ar and $H_2$ into the chamber from the upper gas nozzles and producing a plasma, the i-type µc-Si layer 42 is formed by switching the $Ar/SiH_4/PH_3$ gas mixture to an $Ar/SiH_4$ gas mixture and introducing it from the lower gas nozzles or the lower gas shower plate. Further, while continuously supplying the mixed gas of Ar and $H_2$ into the chamber from the upper gas nozzles and producing a plasma, the $p^+$-type µc-Si layer 423 is formed by replacing the $Ar/SiH_4$ gas mixture from the lower gas nozzles or the lower gas shower plate by an $Ar/SiH_4/B_2H_6$ gas mixture. Then, while continuously supplying the mixed gas of Ar and $H_2$ into the chamber from the upper gas nozzles and producing a plasma, the Ni layer 44 is formed by CVD by replacing the $Ar/SiH_4/B_2H_6$ gas mixture from the lower gas nozzles or the lower gas shower plate by a mixed gas containing Ar and Ni.

In this manner, since the formation and etching of the nine layers are carried out by switching the feed gases in sequence in the same MSEP type plasma processing apparatus, it is possible to form the excellent films with few defects and simultaneously to significantly reduce the manufacturing cost.

The glass substrate 14 formed with the Ni layer 44 and the two power generating laminates 22 and 42 is introduced from the fourth plasma processing apparatus into a photoresist coater (slit coater), where a photoresist is coated and then the photoresist is patterned using the photolithography technique.

After patterning the photoresist, the glass substrate 14 formed with the Ni layer 44 and the two power generating laminates 22 and 42 is, along with the patterned photoresist, introduced into the fifth plasma processing apparatus having lower gas nozzles or a lower gas shower plate. In the fifth plasma processing apparatus, the Ni layer 44 and the two power generating laminates 22 and 42 are selectively etched using the photoresist as a mask so that the via holes 244 reaching the first electrodes 20 are formed. That is, the seven layers are continuously etched in the fifth plasma processing apparatus.

Specifically, the etching of the Ni layer 44 is carried out by, while supplying a mixed gas of Ar and $H_2$ into a chamber from upper gas nozzles and producing a plasma, ejecting a mixed gas of Ar and $CH_4$ into the plasma from the lower gas nozzles or the lower gas shower plate. Subsequently, while continuously supplying Ar into the chamber from the upper gas nozzles and producing a plasma, the etching of the two power generating laminates 22 and 42 comprising the nip-nip six layers is carried out by ejecting an Ar/HBr gas mixture from the lower gas nozzles or the lower gas shower plate.

The glass substrate 14 is provided, by the etching in the fifth plasma processing apparatus, with the via holes 244 that pass through the layers from the Ni layer 44 and that reach the first electrodes 20. Then, the glass substrate is transferred from the fifth plasma processing apparatus into the above-mentioned third plasma processing apparatus having neither lower gas nozzles nor a lower gas shower plate, where the photoresist is removed by ashing in a plasma produced in an atmosphere of a $Kr/O_2$ gas mixture introduced into a chamber from upper gas nozzles.

The glass substrate 14, after the removal of the photoresist, is transferred into the sixth plasma processing apparatus having lower gas nozzles or a lower gas shower plate, where the Al layer having a thickness of 1 μm is formed as the second electrode 26 on the Ni layer 44. The Al layer is also formed in the via holes 244. The formation of the Al layer is carried out by, while supplying a mixed gas of Ar and $H_2$ into a chamber from upper gas nozzles and producing a plasma, ejecting an $Ar/Al(CH_3)_3$ gas mixture into the plasma, produced in the $Ar/H_2$ atmosphere, from the lower gas nozzles or the lower gas shower plate.

Subsequently, a photoresist is coated on the Al layer, i.e. the second electrode 26, and then is patterned. The glass substrate 14 with the patterned photoresist is introduced into the seventh plasma processing apparatus having lower gas nozzles or a lower gas shower plate.

In the seventh plasma processing apparatus, the Al layer is etched by, while supplying an Ar gas into a chamber from upper gas nozzles and producing a plasma, ejecting an $Ar/Cl_2$ gas mixture into the plasma, produced in the Ar atmosphere, from the lower gas nozzles or the lower gas shower plate. Subsequently, while supplying a mixed gas of Ar and $H_2$ into the chamber from the upper gas nozzles and producing a plasma, the Ni layer 44 is etched by introducing an $Ar/CH_4$ gas mixture from the lower gas nozzles or the lower gas shower plate into the plasma produced in the $Ar/H_2$ atmosphere. Then, while supplying an Ar gas into the chamber from the upper gas nozzles and producing a plasma, the $p^+$-type μc-Si layer 423, the i-type μc-Si layer 422, the n-type μc-Si layer 421, the p-type a-Si layer 223, and part of the i-type a-Si layer 222 are etched by switching the gases from the lower gas nozzles or the lower gas shower plate to an Ar/HBr gas mixture. As a result, the insulating holes 245 reaching midway of the i-type a-Si layer 222 from a surface of the Al layer 26 are formed. Also in this process, the seven layers are continuously etched by switching the gases in sequence in the same MSEP type plasma processing apparatus. Thus, the processing time and cost are significantly reduced.

Then, the glass substrate 14 having thereon the elements is transferred into the above-mentioned third plasma processing apparatus having neither lower gas nozzles nor a lower gas shower plate, where the photoresist is removed by ashing in a plasma produced in an atmosphere of a $Kr/O_2$ gas mixture introduced into the chamber from the upper gas nozzles.

The glass substrate 14 having, as the second electrode 26, the Al layer with the photoresist removed is introduced into the eighth plasma processing apparatus having lower gas nozzles or a lower gas shower plate, where a SiCN film is formed by CVD so that an insulating layer 28 is formed on the Al layer 26 and in the holes 225. As a consequence, the required photoelectric conversion elements and solar cell unit and/or solar cell module are produced. The SiCN film is formed by supplying a $Xe/NH_3$ gas mixture into a chamber from upper gas nozzles, producing a plasma, and ejecting an $Ar/SiH_4/SiH(CH_3)_3$ gas mixture from the lower gas nozzles or the lower gas shower plate.

INDUSTRIAL APPLICABILITY

According to this invention, using silicon and ZnO with large reserves, it is possible to produce a photoelectric conversion element and a solar cell unit/module with thin film thickness of amorphous silicon, which have high energy conversion efficiency. As a consequence, it is possible to manufacture a large-area high-power solar cell at a low cost.

In the above-mentioned embodiment, the description has been mainly given of only the photoelectric conversion element and/or solar cell unit which uses one set of the nip structure. However, this invention is by no means limited thereto and is also applicable to a photoelectric conversion element module and a solar cell module comprising a plurality of sets of power generating laminates each having an nip structure. In this case, it may be configured that an n-type a-Si layer of the power generating laminate on the transparent first electrode side is in contact with an $n^+$-type ZnO layer serving as a first electrode, while, a p-type a-Si layer of the power generating laminate on the second electrode side is in contact with a second electrode.

DESCRIPTION OF SYMBOLS 10 photoelectric conversion element
12 guard glass
14 soda glass substrate
16 sodium barrier film
20 first electrode ($n^+$-type ZnO layer)
22 power generating laminate
221 $n^+$-type a-Si layer
222 i-type a-Si layer
223 $p^+$-type a-Si layer
24 selenium layer
26 second electrode (Al layer)
28 insulating layer (SiCN layer)

201 insulating layer (SiCN layer)
224 SiO$_2$ layer
30 heat sink
40 photoelectric conversion element
42 second power generating laminate
421 n$^+$-type μc-Si layer
422 i-type μc-Si layer
423 p$^+$-type μc-Si layer
44 nickel (Ni) layer
244 via hole
245 insulating hole

The invention claimed is:

1. A photoelectric conversion element stacked from an incident side of light in order of a glass substrate, a transparent electrode of transparent conductive oxide (TCO), a power generating laminate of an n-i-p structure successively stacked in order from the incident side, a back electrode, a SiCN layer directly attached to a side of the back electrode as a passivation film, and a heat sink on the SiCN layer,
wherein the SiCN layer is between the back electrode and the heat sink;
wherein the transparent electrode of TCO is of n$^+$-type ZnO and is directly contacted with an n-type semiconductor of the n-i-p structure and with the glass substrate;
wherein a layer of Se or Pt is located between the p-type semiconductor of the n-i-p structure and the back electrode; and
wherein the n$^+$-type ZnO has a conduction band lower than that of the n-type semiconductor of the n-i-p structure.

2. The photoelectric conversion element according to claim 1, wherein the ZnO is doped with at least one of Ga, Al, and In and has an n-type conductivity.

3. The photoelectric conversion element according to claim 1, wherein the glass substrate is formed by soda glass.

4. The photoelectric conversion element according to claim 3, further comprising:
a sodium barrier layer between the glass substrate and the transparent electrode.

5. The photoelectric conversion element according to claim 1, wherein the power generating laminate is formed by amorphous silicon.

6. The photoelectric conversion element according to claim 5, wherein the power generating laminate of the amorphous silicon is stacked on the transparent electrode of the n$^+$-type ZnO in order of an n$^+$-type amorphous silicon layer, an i-type amorphous silicon layer, and a p$^+$-type silicon layer which are successively stacked from the incident side.

7. The photoelectric conversion element according to claim 6, further comprising a second power generating laminate of an n-i-p structure which is adjacent to and contacted with said power generating laminate and which is located between the power generating laminate and the back electrode;
wherein the second power generating laminate has an n+-type semiconductor layer contacted with the p+-type amorphous silicon of the power generating laminate.

8. The photoelectric conversion element according to claim 7, wherein the second power generating laminate is formed by microcrystalline silicon.

9. The photoelectric conversion element according to claim 5, wherein the heat sink is attached through an adhesive layer to the SiCN layer.

10. The photoelectric conversion element according to claim 1, wherein the conduction band of the n$^+$-type ZnO is lower than a conduction band of the n-type silicon by 0.2 eV to cause electrons to flow from the n-type silicon into the n$^+$-type ZnO.

11. A photoelectric conversion element stacked from an incident side of light in order of a glass substrate, a transparent electrode of transparent conductive oxide (TCO), a first power generating laminate of an n-i-p structure successively stacked in order from the incident side, a second generating laminate of an n-i-p structure, a back electrode, a SiCN layer directly attached to a side of the back electrode as a passivation film, and a heat sink on the SiCN layer,
wherein the SiCN layer is between the back electrode and the heat sink;
wherein the transparent electrode is of n$^+$-type ZnO and is directly contacted with an n-type semiconductor of the n-i-p structure in the first power generating laminate and with the glass substrate;
wherein a layer of Ni is located between the p-type semiconductor of the n-i-p structure in the second generating laminate and the back electrode;
wherein the p-type semiconductor in the first generating laminate is directly contacted with the n-type semiconductor in the second generating laminate; and
wherein the transparent electrode of the n$^+$-type ZnO has a conduction band lower than that of the n-type semiconductor of the n-i-p structure in the first power generating laminate.

* * * * *